United States Patent [19]

Su

[11] Patent Number: 5,511,086

[45] Date of Patent: Apr. 23, 1996

[54] LOW NOISE AND NARROW LINEWIDTH EXTERNAL CAVITY SEMICONDUCTOR LASER FOR COHERENT FREQUENCY AND TIME DOMAIN REFLECTOMETRY

[75] Inventor: Chin B. Su, College Station, Tex.

[73] Assignee: The Texas A&M University System, College Station, Tex.

[21] Appl. No.: 408,739

[22] Filed: Mar. 22, 1995

[51] Int. Cl.$^6$ .................................................... H01S 3/13
[52] U.S. Cl. ............................. 372/31; 372/20; 372/19; 372/28; 372/98; 372/102; 372/32; 372/96
[58] Field of Search ............................. 372/98, 92, 102, 372/26, 31, 32, 20, 19, 96, 28, 94

[56] References Cited

U.S. PATENT DOCUMENTS

| | | | |
|---|---|---|---|
| 5,164,954 | 11/1992 | Su ................................................ | 372/20 |
| 5,392,308 | 2/1995 | Welch et al. ................................. | 372/32 |

Primary Examiner—Leon Scott, Jr.
Attorney, Agent, or Firm—Baker & Botts

[57] ABSTRACT

A semiconductor laser (10) having an external cavity used for coherent frequency and time domain reflectometry is provided. The laser (10) provides a very stable single longitudinal mode characteristic, a very narrow lasing linewidth, and a very low noise optical output. The laser (10) includes a semiconductor optical amplifier (14) emitting a coherent light beam from one facet, a phase modulator (22) receiving the coherent light beam and linearly varying an optical frequency of the laser, and an etalon (32) selecting and stabilizing one longitudinal mode of the laser cavity for lasing, narrowing the linewidth and reducing the noise. A computer-controlled and piezoelectric actuated wavelength-selective grating (58) varies the length of the laser cavity and thereby tuning the optical frequency of the selected longitudinal mode to track the transmission frequency of the etalon by maintaining maximum power intensity thereby stabilizing the selected mode. A selected portion of the coherent light beam is directed back to the semiconductor optical amplifier (14) and further amplified. A reference portion of the light beam is coherently mixed with a back-scattered signal portion of the light beam to yield reflectometry measurement or detection.

20 Claims, 4 Drawing Sheets

LOW NOISE AND NARROW LINEWIDTH EXTERNAL CAVITY SEMICONDUCTOR LASER FOR COHERENT FREQUENCY AND TIME DOMAIN REFLECTOMETRY

TECHNICAL FIELD OF THE INVENTION

This invention relates to the general field of loss measurements and fault detections in optical fibers and optical fiber systems. In particular, the invention is a very narrow linewidth and low-noise external cavity semiconductor laser used for sensitive frequency and time domain reflectometry.

BACKGROUND OF THE INVENTION

The Optical Time Domain Reflectometer (OTDR) is the standard equipment for determining fault locations and loss characteristics of optical fibers. To determine the loss characteristics or fault locations, the OTDR sends out an optical pulse and clocks the return pulse reflected from a fault or from the Rayleigh backscattered process. The delay-time of the return pulse gives the spatial location of the reflection. The key issues regarding the performances of reflectometers are detection sensitivity (often called the dynamic range), spatial resolution, and the dead-zone problem. The term "dead-zone" relates to the initial length of optical fiber that is inaccessible for measurement because of the strong Fresnel reflection at the input end of the fiber. This problem plagues all time domain techniques.

To address the sensitivity issue, coherent optical time domain technique has been deployed. This approach is described by H. Izumita et al. in *Journal of Lightwave Technology*, vol. 12, no. 7, pages 1230–1238, 1994. The light source is a distributed-feedback semiconductor laser which requires linewidth narrowing by using optical feedback from a one kilometer length of fiber. The optical pulse is generated by a $LiNbO_3$ electro-optic modulator. This technique offers shot-noise-limited performance but the light source may be unstable because a long fiber length is used for feedback to achieve narrow linewidth. Moreover, the dead-zone problem is not addressed. Various frequency domain reflectometry techniques have also been implemented. Frequency domain techniques typically modulates the amplitude of the light or ramping the optical frequency of the optical carrier. The technique which involves the modulation of the amplitude is described by *MacDonald in Applied Optics*, vol. 20., no. 10, pages 1840–1844, 1981. This technique has not been competitive and is largely abandoned. In techniques involving the ramping of the optical frequency, distributed-feedback semiconductor lasers (DFB laser) and Nd:YAG ring lasers have been used as light sources. Both techniques suffer from the fact that the optical frequency can be varied only by temperature tuning which resulted in a nonlinear and unpredictable frequency change with time. Thus, the spatial resolution is severely degraded for long fiber lengths, thus limiting its usefulness to measurements of short fibers. The technique which uses the DFB laser is described by K. Takada in *IEEE Photonics Technology Letters*, Vol. 4, no. 9, pages 1069–1072, 1992, and the technique which uses Nd:YAG ring laser is described by Sorin in *IEEE Photonics Technology Letters*, vol. 2, no. 12, pages 902–904, 1990.

Accordingly there is a need for an optical system which overcomes the detection sensitivity, spatial resolution, and the dead-zone problems left unresolved by previous efforts as described above.

SUMMARY OF THE INVENTION

In accordance with the present invention, a laser is provided which eliminates or substantially reduces the disadvantages associated with prior lasers.

In one aspect of the invention, a semiconductor laser having an external cavity used for coherent frequency and time domain reflectometry is provided. The laser provides a very stable single longitudinal mode characteristic, a very narrow lasing linewidth, and a very low noise optical output.

In another aspect of the invention, the laser includes a semiconductor optical amplifier emitting a coherent light beam from the front facet, a phase modulator receiving the coherent light beam and linearly varying an optical frequency of the laser, and an etalon selecting one longitudinal mode of the laser cavity for lasing. A computer-controlled and piezoelectric actuated wavelength selective grating varies the length of the laser cavity and thereby tuning the optical frequency of the selected longitudinal mode for the purpose of tracking the transmission frequency of the etalon by maintaining maximum power intensity. A selected portion of the coherent light beam is directed back to the semiconductor optical amplifier and further amplified. A reference portion of the light beam is coherently mixed with a backscattered signal portion of the light beam to yield reflectometry measurement or detection.

In yet another aspect of the invention, the present invention makes use of an external cavity semiconductor laser as the light source for the coherent frequency and time domain reflectometer. Both functions are incorporated in the same instrument. The design of the laser is such that the optical frequency can be linearly ramped by applying a ramp or a triangular-wave voltage on an intra-cavity phase modulator. Because the ramp frequency is linear and predictable, the spatial resolution is not compromised for long fiber length. Thus, long and short fibers can both be measured.

In yet another aspect of the invention, an external cavity semiconductor laser is used as a light source for building the coherent frequency domain and time domain reflectometer. A phase modulator is used inside the laser cavity such that the optical frequency of the laser can be controlled and ramped by application of a voltage on the phase modulator. Therefore, the time dependent ramp frequency can be linear and predictable, which is required for optimal performance of the coherent frequency domain reflectometer.

In another aspect of the invention, a standing-wave laser may be used as well as a traveling-wave laser.

BRIEF DESCRIPTION OF THE DRAWINGS

For a better understanding of the preferred embodiment of the present invention, reference may be made to the accompanying drawings, in which.

DETAILED DESCRIPTION OF THE INVENTION

The present invention is concerned with the development of an external cavity semiconductor laser for use as a coherent frequency and time domain reflectometer. The critical parameter required of such lasers are: a very stable single longitudinal characteristic, a very narrow lasing linewidth, and a very low noise optical output. The present invention is related to the invention disclosed in U.S. Pat. No. 5,164,954 issued on Nov. 17, 1992 to Su, which is incorporated herein by reference.

Figure 1:
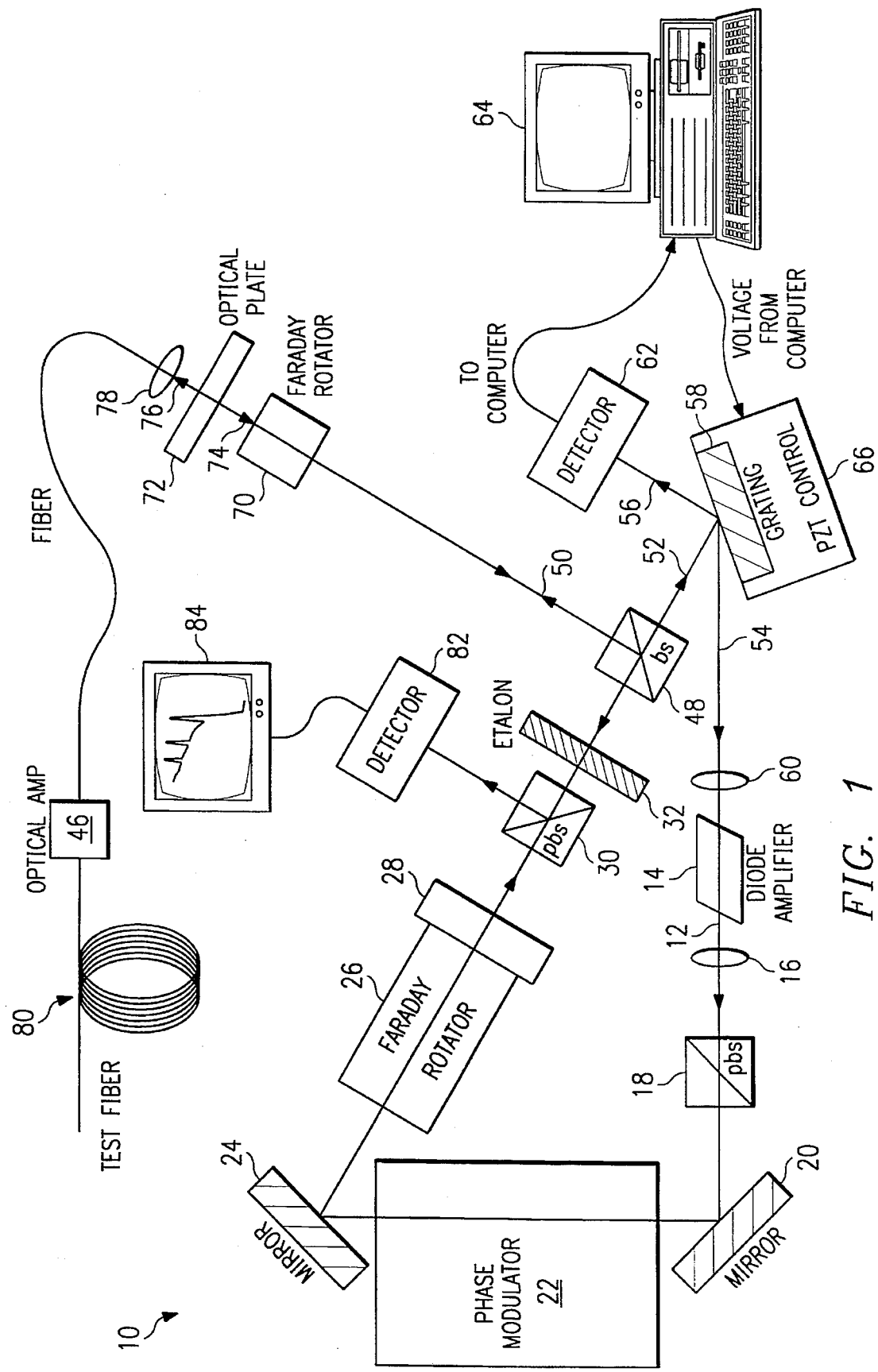
FIG. 1 is a schematic layout of an embodiment of the present invention for coherent frequency and time domain reflectometry using a traveling-wave laser.

Referring to FIG. 1, an embodiment of the traveling-wave laser 10 constructed according to the teachings of the present invention is shown. A coherent optical radiation or light beam 12 is generated by a light source 14, such as a semiconductor optical amplifier. The wavelength of the light beam 12 may be set according to application requirements, and may include wavelengths of 1.3 µm, 1.5 µm, and 0.8 µm. The coherent light beam 12 from the light source 14 passes through a collimating lens 16 which may be a GRIN lens or SEL-FOC lens. The light beam 12 then passes through a polarizing beam splitter (PBS) 18, and is then reflected by a mirror 20 to a phase modulator 22. The polarizing beam splitter 18 rejects vertically polarized light from the light beam 12 and allows horizontally polarized (or transverse electrical polarized) light to be transmitted to the phase modulator 22. A voltage waveform is applied to the phase modulator 22 to modulate the resonant optical frequency of the laser. The optical frequency thus replicates the input voltage waveform. The voltage waveform may be in the form of a triangular or sawtooth waveform. The phase modulator 22 may be implemented by a New Focus Model 4004.

The light beam then proceeds from the phase modulator 22, is reflected by a second mirror 24, and passes through a Faraday rotator 26, a half-wave ($\lambda/2$) plate 28, and another polarizing beam splitter 30. The Faraday rotator 26 rotates the polarization of the light beam 45° in one direction, and the half-wave plate 28 rotates the polarization of the beam by 45° in the opposite direction to return it to horizontal polarization. The resultant polarization of the light beam after the combination of the Faraday rotator 26 and the half-wave plate 28 is horizontal. The second polarizing beam splitter 30 further "filters" the light beam and transmits only horizontally polarized portion of the light beam to a solid or air-gap etalon 32.

Figure 2:
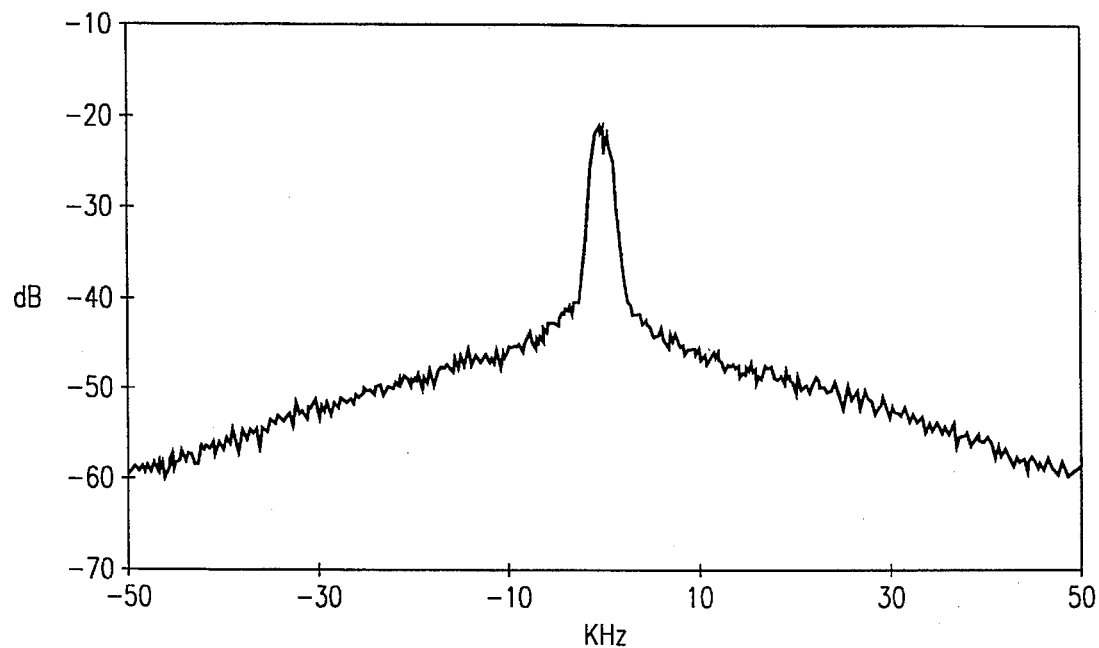
FIG. 2 is a plot showing the narrow linewidth measured by a microwave spectrum analyzer.
Figure 3:
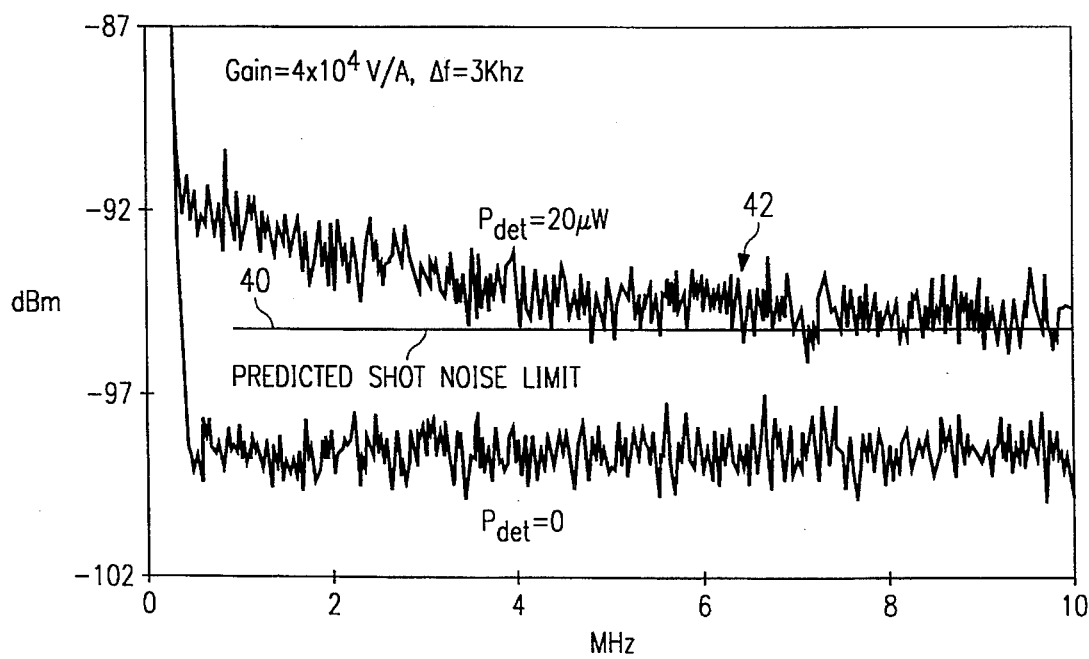
FIG. 3 plot showing the measured noise level of the present laser at a detected power of 20 µW and the instrument noise level at zero optical power.

The etalon 32 may be a Virgo Optics Model ES254-010 having a reflectivity of 97.5% and a thickness of 2 mm. As known in the art, the parameters of the etalon 32 may be selected depending on the dimension of the laser cavity. The etalon 32 in the present invention performs multifunctional tasks. First, the etalon 32 performs a strong selection for lasing of only one single longitudinal-mode of the laser cavity. Second, the etalon 32 reduces the laser's linewidth from approximately 100 kHz to approximately 15 kHz. The measured linewidth is shown in FIG. 2, which shows a greatly reduced linewidth of 15 kHz. Third, the etalon 32 reduces the detected noise by filtering out the spontaneous emissions. Due to the etalon's reflectivity of 97.5%, the finesse of the etalon 32 is 100 so that the detected spontaneous emission noise is reduced by a factor of 100. The noise spectrum is shown in FIG. 3. According to a detected power of 20 µW, the expected shot-noise-limit is depicted by the solid line 40. The measured noise level 42 approaches the shot-noise limit for frequency above 2 MHz, and is only a few dB above the shot-noise level for frequency below 2 MHz. Fourth, the etalon 32 also reduces the detected spontaneous emission noise from an external optical amplifier 46 used for amplifying the power from the present laser and for implementing the coherent time domain reflectometry technique.

The light beam exiting the etalon 32 proceeds to the beam splitter (BS) 48 which divides the beam into two light beams progressing on two different paths 50 and 52. Path 50 is the light output path to the test fiber. The light beam traveling on path 52 is further divided into two light beams progressing on paths 54 and 56 by a wavelength selective grating 58. The light beam following the path 54 passes through a lens 60 and returns to the back-facet of the optical amplifier 14. The lens 60 may be another GRIN or SEL-FOC lens. The returning light beam then reaches the back facet of the semiconductor diode amplifier 14, becomes amplified by the amplifier 14, and leaves the front facet of the diode amplifier 14 down the path again. As the optical amplifier 14 continues to provide gain, the horizontally polarized portion of the traveling light beam becomes increasingly stronger, and the vertically polarized portion essentially disappears.

The light beam traveling on the path 56 is provided as an output to a detector 62 used for sensing and controlling the light output for stabilizing the single longitudinal-mode. Changes in the output light intensity or power is sensed by the detector and this information is provided to a computer, microprocessor, or a controller 64. The detector may be a Judson Model J168SPR03M. The computer 64 controls a piezoelectric (PZT) drive 66 coupled to the grating 58 in response to the light intensity detected by the detector 62. The piezoelectric drive 66 changes the position of the grating 58 so that the frequency of the lasing longitudinal mode shifts to track the transmission maximum of the etalon 32 which may drift with environmental temperature or pressure variations. In essence, the computer 64 causes the piezoelectric drive 66 to slightly move the grating 58 to change the cavity of the laser or the overall path length of the light beam so that the power detected by the detector 62 remain substantially constant at a maximum. The control capability provided by the computer-controlled piezoelectric drive 66 assures the long-term stability of the lasing single longitudinal mode.

The light beam traveling on output path 50 is used for reflectometry measurements. The output light beam proceeds to a second Faraday rotator 70 and then to an optical plate or half-wave plate 72 where a fraction of the light 74, herein referred to as the reference light, $P_{ref}$, is reflected back toward the Faraday rotator 70 from the optical plate 72. The remaining light 76 is transmitted by the optical plate 72 through a lens 78 to an optical amplifier 46 if signal amplification is desired. A fiber optical amplifier or semiconductor optical amplifier may be used. The light is then launched into a length of test fiber 80 or directed to an object for reflectometry measurements. The half-wave plate 72 is used if the optical amplifier 46 has an imbalanced gain in certain polarization axes. Alternatively, the optical plate 72 is used if the gain in the amplifier 46 is substantially the same for all axes. The side of the half-wave plate 72 facing the Faraday rotator 70 is coated with a reflective coating to generate the reflected reference light, $P_{ref}$.

The polarization of the reference light, $P_{ref}$, reflected by the optical plate 72 is rotated 90° upon existing the Faraday rotator 70. The reflected reference light is further deflected by the beam splitter 48 and the polarizing beam splitter 30 into a detector 82. The detector 82 may be a New Focus Model 1811. The detected reference signal may be displayed on a graphical interface, recorded in some storage medium, and/or analyzed by a computer 84.

The light traveling in the test fiber 80 or trained on the measurement object is backscattered by a disturbance or fault. The backscattered light from the test fiber 80 or object, herein referred to as the signal light, $P_{sig}$, follows the same path back through the beam splitter 48 and polarizing beam splitter 30 as the reference light, $P_{ref}$, and is also detected by the detector 82 and provided to the output medium 84. The reference light and the signal light are mixed coherently at the detector 82. The coherently mixed signal is proportional to $2(P_{ref}P_{sig})^{1/2}$. For frequency domain reflectometry applications, the optical frequency varies linearly as a function of time. Therefore, the radio frequency of the coherently mixed signal is indicative of the distance between the disturbance or fault in the test fiber 80 causing the backscattered signal light and the optical plate 72. The formula for conversion of frequency, $f_{RF}$, to distance, L, is given by $$f_{RF}=(V_m/T)(2nL/c) \quad (1)$$

where $V_m$ is the total linear frequency excursion, T is the ramped period of the triangular wave or sawtooth waveform used in the phase modulator 22, n is the fiber index, and c is the speed of light.

Figure 4:
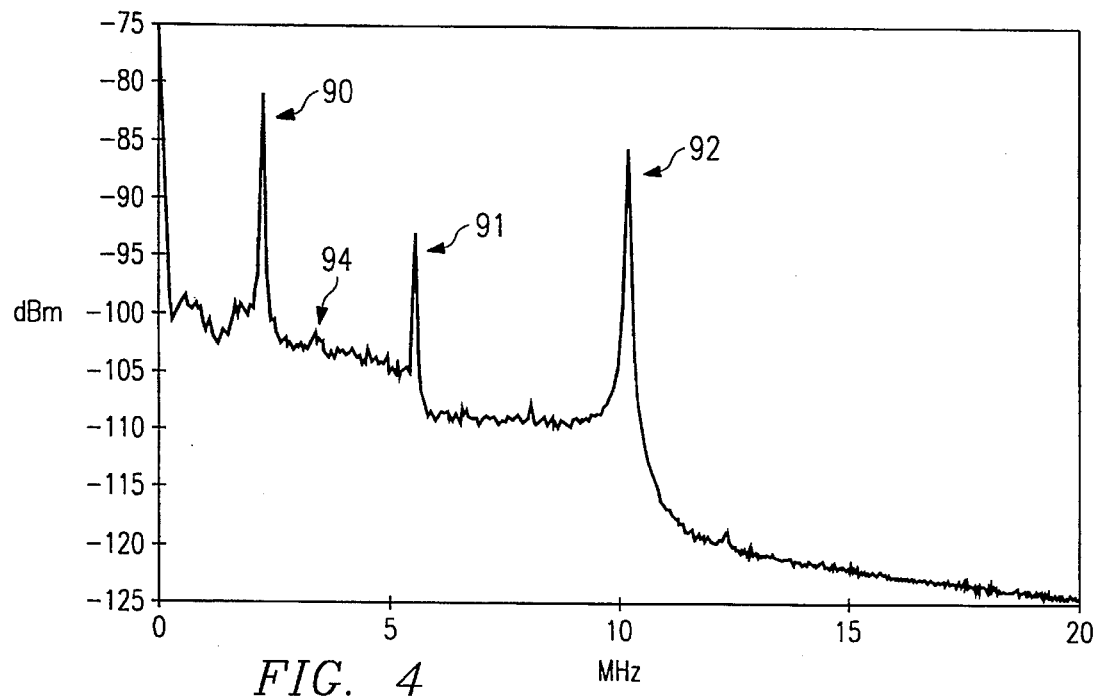
FIG. 4 plot showing the spectrum of the coherently mixed reflected signal from a 10 km test fiber measured by a spectrum analyzer.

The spectrum of the coherently mixed signal from a 10 km length of test fiber is shown in FIG. 4. The three signal peaks 90, 91, 92 are due to Fresnel reflections from two fiber connectors and the end of the 10 km test fiber, respectively. The background signal 94 is due to distributed Rayleigh backscattered light.

Figure 5:
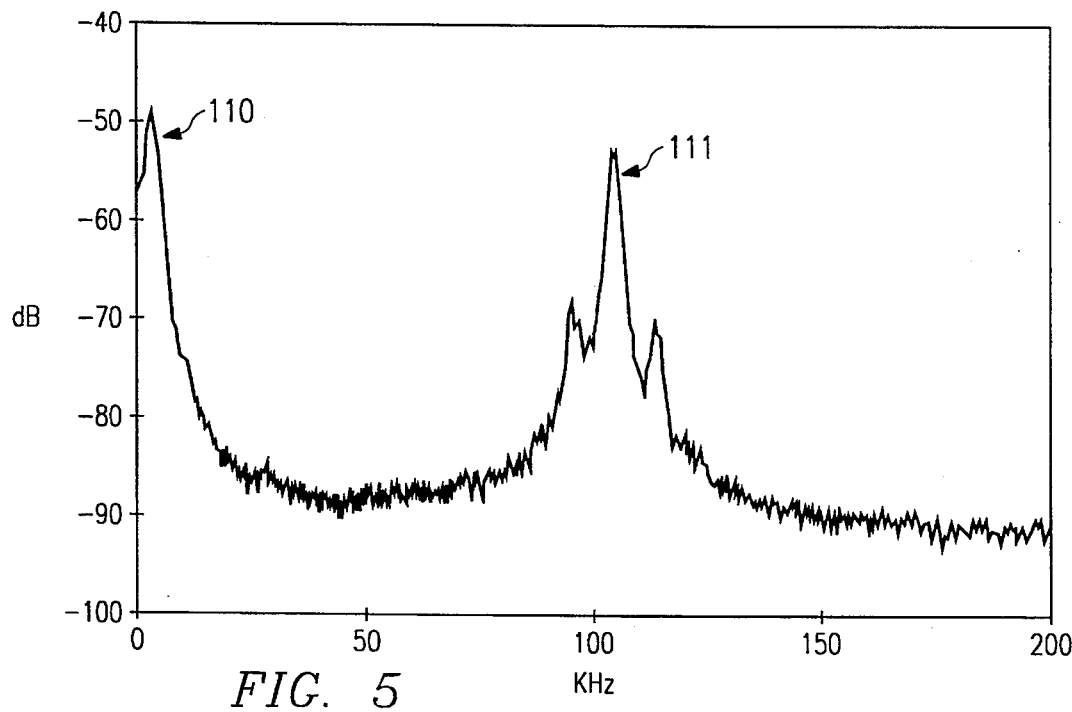
FIG. 5 is a plot showing the reflected signal from two points separated by 100 meters.
Figure 6:
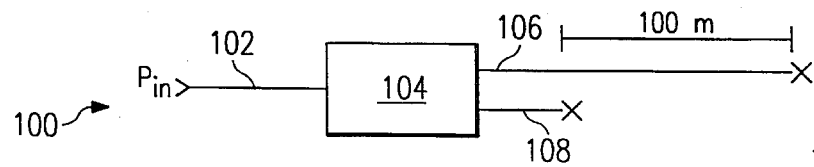
FIG. 6 is a simplified diagram showing a setup for two points separated by 100 meters.

FIG. 5 indicates the spatial resolution by measuring the Fresnel reflections from two points separated by 100 meters. As shown in FIG. 6, the 100-meter separation is simulated by splicing a fiber coupler 104 with unequal output lengths 106 and 108 at the end of a short fiber 102 of a length of, for example, three meters. This situation simulates a short fiber length to test the possible dead-zone problem. The reflected signals from two points separated by 100 meters are indicated by reference numerals 110 and 111. The reflected signals 110 and 111 are strong which indicate that no dead-zone problem is encountered.

The preferred embodiment of the coherent time domain reflectometer application is also shown in FIG. 1. The same laser 10 is used for this application except for two operational differences. First, no voltage is applied to the phase modulator 22, therefore, the optical frequency of the laser is not varied. Second, the optical amplifier 46 is biased at an appropriate DC level, for example, 100 mA for a semiconductor optical amplifier, and modulated by a train of pulse current with a pulse duration of, for example, 100 nanoseconds and a pulse repetition rate of, for example, 1 kHz. Due to the near absence of heating effect during the pulsing operation, the peak optical pulse power generated may exceed 100 mW. The higher power increases the dynamic range of the reflectometer. This technique generates an optical pulse train and achieves optical amplification simultaneously. The backscattered optical pulse signal, $P_{sig}$, is also coherently mixed with the reference light, $P_{ref}$, as in the case of the frequency domain reflectometry. The time-delay of the return pulse signal, $P_{sig}$, indicates the distance to the reflection point.

Figure 7:
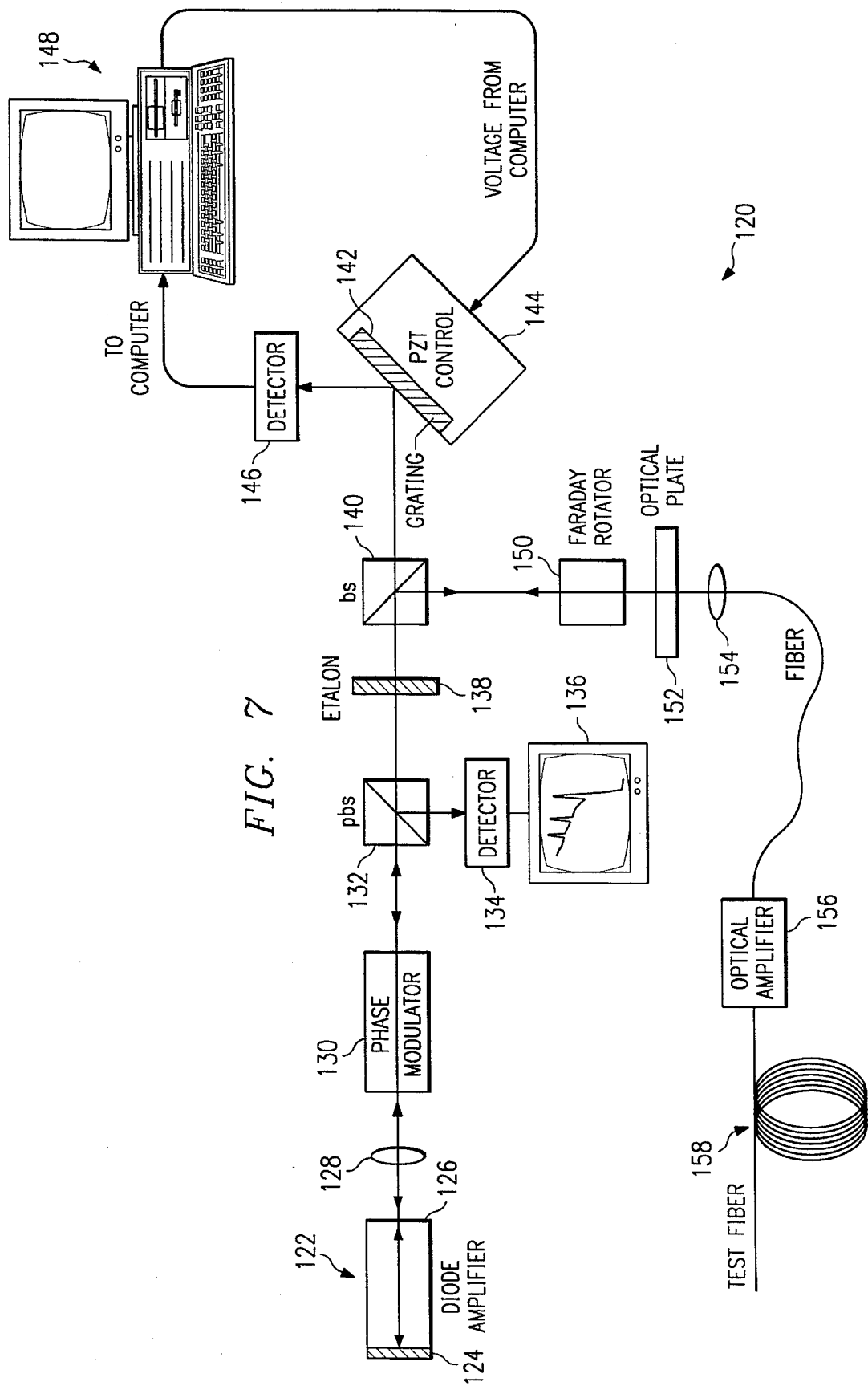
FIG. 7 is a schematic diagram of another embodiment of the present invention using a standing-wave laser.

Referring to FIG. 7, a standing-wave laser embodiment 120 constructed in accordance with the present invention is shown. The standing-wave laser embodiment is similar in construction as the traveling-wave laser embodiment with similar components. A coherent light beam is generated by a semiconductor diode amplifier 122. The diode amplifier 122 has a back and front facet 124 and 126. The light beam exits from the front facet 126 and passes through a collimating lens 128. The light beam is transmitted to a phase modulator 130 which modulates the resonant optical frequency of the laser by an input sawtooth or triangular voltage waveform. The light beam then passes through a polarizing beam splitter 132 and an etalon 138. The polarizing beam splitter 132 rejects vertically polarized light and allows horizontally polarized light to pass through. The etalon 138 selects and stabilizes a single longitudinal mode of the laser cavity, reduces the laser's linewidth, and further reduces the noise level. The light beam then passes through a beam splitter 140, which splits the light into two portions. The first light portion is further divided into two by a wavelength-selective grating 142 variable by a piezoelectric drive 144. One portion of the divided light becomes detected by a detector 146, which senses the power of the light output for stabilizing the single longitudinal mode. The sensed light power or intensity is provided to a computer 148 which uses this information to change the position of the grating 142 by controlling the piezoelectric drive 144 to achieve and maintain the transmission maximum of the etalon 138.

The other portion of the light beam divided by the grating 142 returns along the same path toward the diode amplifier 122 and is reflected back by the back facet 124 of the diode amplifier 122. Therefore, variation in the grating position changes the laser cavity or the effective path length of the light to track the maximum transmission intensity of the etalon 138.

The beam splitter 140, which split the light prior to the grating 142, provides the signal light, $P_{sig}$. The light passes through a Faraday rotator 150 and then an optical plate or half-wave plate 152, where a fraction of the light, $P_{ref}$, is reflected back toward the Faraday rotator 150. The remaining light is transmitted by the optical plate 152 through a collimating lens 154 and proceeds to an optical amplifier 156. The light is then injected into a test fiber or directed to an object 158 for reflectometry measurements.

The reference light, $P_{ref}$, reflected by the optical or half-wave plate 152 is rotated 45° and deflected by the polarizing beam splitter 132 into a detector 134. The backscattered light from the test fiber 158 or measurement object returns along the same route to the polarizing beam splitter 132 and detector 134. The signal light and the reference light mix coherently at the detector 134 and provides the needed reflectometry measurement information. Similarly as in FIG. 1, time domain reflectometry is obtained by not applying an input voltage waveform at the phase modulator 130 and modulate the optical amplifier 156 with a current pulse train.

Although the present invention and its advantages have been described in detail, it should be understood that various changes, substitutions and alterations can be made therein without departing from the spirit and scope of the invention as defined by the appended claims.

What is claimed is:

1. A semiconductor laser having an external cavity used for coherent frequency and time domain reflectometry comprising:

a semiconductor optical amplifier having a front and back facet and emitting a coherent light beam from said front facet;

a phase modulator receiving said coherent light beam and linearly varying an optical frequency of the laser;

an etalon selecting and stabilizing one longitudinal mode of the laser cavity for lasing, narrowing the lasing linewidth and reducing the noise of the laser;

means for varying the length of the laser cavity and thereby tuning the optical frequency of said selected longitudinal mode to track the transmission frequency of the etalon by maintaining maximum power intensity; and means for communicating and directing a portion of said coherent light beam to said back facet of said semiconductor optical amplifier; whereby a reference portion of said coherent light beam is coherently mixed with a back scattered signal portion of said light beam to yield coherent frequency and time domain reflectometry measurement or detection.

2. The laser, as set forth in claim 1, wherein said means for varying the laser cavity length comprises:

a detector receiving a portion of said coherent light beam and detecting its power intensity;

a wavelength selective grating; and a piezoelectric drive coupled to said grating and varying a position thereof in response to said detected power intensity of said portion of said coherent light beam.

3. The laser, as set forth in claim 1, wherein said phase modulator applies a periodic ramp waveform modulation voltage for modulating the optical frequency of the laser.

4. The laser, as set forth in claim 1, further comprising:

a partially reflecting optical plate generating said reference portion of the coherent light beam; and a detector receiving and sensing said reference portion of the coherent light beam.

5. The laser, as set forth in claim 4, further comprising a Faraday rotator for rotating a polarization of the reference portion of the coherent light beam by 90 degrees to direct the reference portion of the light beam to said detector.

6. The laser, as set forth in claim 4, further comprising:

means for transmitting said signal portion of said coherent light beam into a test fiber and generating said backscattered signal light; and said detector further receiving said backscattered signal light and coherently mixing with said reference portion of the light beam.

7. The laser, as set forth in claim 6, further comprising an optical amplifier amplifying said signal portion of said light beam prior to its entry into said test fiber.

8. The laser, as set forth in claim 7, wherein said optical amplifier produces an optical pulse train with high peak power for coherent time domain reflectometry.

9. The laser, as set forth in claim 1, wherein said means for communicating and directing comprises:

at least one polarizing beam splitter transmitting only portions of the coherent light beam having a selected axis of polarization; and means for maintaining said selected axis of polarization of portions of said light beam traveling back to said back facet of said semiconductor optical amplifier.

10. The laser, as set forth in claim 1, wherein said means for communicating and directing directs said portion of said light beam back to said back facet through said front facet as in a standing-wave cavity.

11. The method, as set forth in claim 10, wherein said step of communicating and directing comprises the steps of:

transmitting only portions of the coherent light beam having a selected axis of polarization; and maintaining said selected axis of polarization of portions of said light beam traveling back to said origination point.

12. A method for coherent frequency and time domain reflectometry using an external cavity laser, comprising the steps of:

generating a coherent light beam at an origination point;

phase modulating said coherent light beam and linearly varying an optical frequency of the laser;

selecting and stabilizing one longitudinal mode of the laser cavity for lasing;

varying the length of the laser cavity and thereby tuning the optical frequency of said selected longitudinal mode to match the transmission frequency of an etalon by maintaining maximum power intensity;

narrowing the linewidth and reducing the noise of the laser; and communicating and directing a portion of said coherent light beam back to said origination point, whereby a reference portion of said coherent light beam is coherently mixed with a back scattered signal portion of said light beam to yield coherent frequency and time domain reflectometry measurement or detection.

13. The method, as set forth in claim 12, wherein the step of varying the laser cavity length comprises the steps of:

receiving the coherent light beam at a wavelength selective grating;

varying a position of the wavelength selective grating by actuating a piezoelectric drive coupled thereto.

14. The method, as set forth in claim 12, wherein the step of varying the laser cavity size further comprises the steps of:

receiving a portion of said coherent light beam and detecting its power intensity; and actuating said piezoelectric drive in response to the detected power intensity to maintain a maximum power intensity.

15. The method, as set forth in claim 12, wherein the phase modulating step further applies a periodic ramp waveform modulation voltage for modulating the optical frequency of the laser.

16. The method, as set forth in claim 12, further comprising the steps of:

generating a reference portion of the coherent light beam; and detecting said reference portion of the coherent light beam.

17. The method, as set forth in claim 16, further comprising the steps of:

transmitting said signal portion of said coherent light beam into a test fiber and generating said backscattered signal light; and receiving said backscattered signal light and coherently mixing with said reference portion of the light beam.

18. The method, as set forth in claim 17, further comprising the step of amplifying said signal portion of said light beam prior to its entry into said test fiber.

19. The method, as set forth in claim 18, further comprising the step of generating an optical pulse train with high peak power for coherent time domain reflectometry.

20. A semiconductor laser having an external cavity used for coherent frequency and time domain reflectometry comprising:

a light source generating and emitting a coherent light beam;

a phase modulator receiving said coherent light beam and linearly varying an optical frequency of the laser;

an etalon receiving and selectively transmitting said coherent light beam thereby selecting and stabilizing one longitudinal mode of the laser external cavity for lasing and narrowing the linewidth and reducing the noise thereof;

means for lengthening and shortening a total path length of said coherent light beam and thereby tuning the optical frequency of said selected longitudinal mode for maintaining maximum power intensity and stabilizing the selected longitudinal mode;

means for communicating and directing a portion of said coherent light beam back to said coherent light source; and said coherent light source amplifying said returned coherent light beam and further emitting said amplified coherent light beam in the same direction, whereby a reference portion of said coherent light beam is coherently mixed with a back scattered signal portion of said light beam to yield coherent frequency and time domain reflectometry measurement or detection.

* * * * *